United States Patent Office 3,666,473

Patented May 30, 1972

3,666,473
POSITIVE PHOTORESISTS FOR PROJECTION EXPOSURE

Lucas A. Colom, Bloomingberg, and Harold A. Levine, Poughkeepsie, N.Y., assignors to International Business Machines Corporation, Armonk, N.Y.

No Drawing. Filed Oct. 6, 1970, Ser. No. 78,610
Int. Cl. G03c *1/52, 1/60*
U.S. Cl. 96—91 D 7 Claims

ABSTRACT OF THE DISCLOSURE

A fast positive photoresist composition employs a mixture of phenol-formaldehyde novolak and resole resins, each having a particular molecular weight distribution as determined by their solubilities in aqueous alkaline solution, together with a conventional diazoketone type of photosensitizer.

BACKGROUND OF THE INVENTION

This invention relates generally to light-sensitive positive photoresist compositions and particularly to phenol-formaldehyde novolak or resole resin based positive photoresists.

Positive photoresist formulations such as are described, for example, in United States Pat. 3,201,239 employ alkali soluble polymers such as phenol-formaldehyde novolak resins together with light-sensitive material which is insoluble in aqueous alkaline solution. When the resist is exposed to actinic radiation the exposed areas dissolve in high pH aqueous alkaline solution (developer). In this way, image-wise exposure of the photoresist layer is utilized to produce a relief pattern of photoresist on a substrate for the purpose of, for example, making exposure masks or resist patterns such as are employed in the manufacture of miniaturized integrated electrical components.

The speed of the resist is defined as the exposure time needed to solubilize the sensitizer to the extent that the exposed resist layer can be completely removed upon development in aqueous alkaline solutions. Speed is important especially in applications where a great number of exposures are needed for example, in generating multiple patterns by a step and repeat process or where, by the nature of the exposure process, light of reduced intensity is employed such as, for example, projection exposure where the light is passed through a series of lenses and monochromatic filters. Speeds available using known photoresist compositions are insufficient to achieve a practical process where a great number of multiple exposures must be made to produce a mask or a series of circuit patterns on a substrate.

BRIEF SUMMARY OF THE INVENTION

It has now been found that the speed of positive photoresists can be increased as much as five times without significant sacrifice in resolution or latitude of processing conditions by utilizing certain mixtures of phenol-formaldehyde resins in a positive resist formulation.

In accordance with this invention, there is provided a positive fast photoresist comprising a composition of a mixture of (a) A first phenol-formaldehyde novolak resin portion which is substantially insoluble in an aqueous alkaline solution having a pH of about 12 or less, (b) A second phenol-formaldehyde novolak or resole resin portion which is rapidly soluble in an aqueous alkaline solution at a pH of about 12 or less, and (c) A sensitizer.

DETAILED DESCRIPTION

The first phenol-formaldehyde resin portion of the resist mixture can be prepared by a well-known process of the acid catalyzed condensation of formaldehyde with an excess of a phenol. Suitable resins are described, for example, in U.S. Pat. 3,201,239. They are prepolymerized phenol-formaldehyde resins prepared by the reaction of formaldehyde with a phenol having the formula

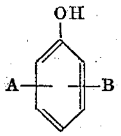

where (A) and (B) are selected from the group consisting of hydrogen and an alkyl group containing from one to six carbon atoms. Suitable resins have a molecular weight distribution such that they are substantially insoluble in aqueous alkaline solutions at or below about pH 12.0, as hereinafter described. The resins have a cloud point of a 1% resin solution in aqueous alkali of about pH 11.30 as hereinafter described.

The second resin portion is a polymer of the phenol-formaldehyde novolak or resole resin class prepared by reacting as is well known in the art in acid or basic solution, respectively, formaldehyde with a phenol having the formula

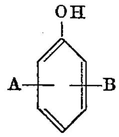

where (A) and (B) are selected from the group consisting of hydrogen and an alkyl group containing from 1 to 6 carbon atoms. Suitable resins are rapidly soluble in aqueous alkaline solution at a pH of about 12 and have a cloud point of a 1% resin solution in aqueous alkali in the range of about pH 10.5 to 11.20, as hereinafter described.

The two resin portions are mixed in a weight ratio such that the desired speed increase is achieved. The limiting factor is that the second resin portion should not be added in amounts so large that the mixture is soluble without exposure to actinic radiation after the addition of sensitizer. Generally the second resin portion will constitute from about 10 to about 30 percent by weight of the total resin solids.

Suitable sensitizers are diazo ketones, for example, those described in U.S. Patent 3,201,239, having the formula

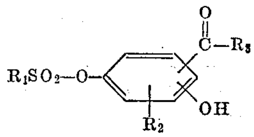

in which $R_1$ is a naphthoquinone-(1,2)-diazide radical, $R_2$ is selected from the group consisting of hydrogen and hydroxyl, and $R_3$ is selected from the group consisting of hydrogen, alkyl, aryl, alkoxy, aryloxy, amino, and heterocyclic groups. An example of such a compound is 4'-2'-3' dihydroxybenzophenone ester of 1-oxo-2-diazo-naphthalene-5-sulfonic acid.

The sensitizers are conventionally employed in amounts of from about 12 to 30% by weight of the resin components of the resist formulation.

The resist formulations are prepared by dissolving the components in a suitable solvent or mixture of solvents so that the compositions can be coated as thin films on various substrates upon the evaporation of the solvent. Suitable solvents include ethers, esters and ketones, for example, methyl or ethyl Cellosolve acetate, with or without small amounts of butyl acetate and xylene; glycol monomethylether; glycol monoethylether; and aliphatic ketones such as methyl isobutyl ketone or acetone. The solids content of the solution is not particularly critical and conventionally will range from about 10 to 40% by weight.

The invention is further illustrated by but is not intended to be limited by the following examples wherein parts are parts by weight unless otherwise indicated.

RATE OF SOLUTION

The rates of solution of the phenol-formaldehyde resins in alkaline solutions were determined by the following procedure. A solution of 18% by weight of the resin in Cellosolve acetate was prepared by dissolving 13.5 grams of resin in 61.5 grams of Cellosolve acetate. A few drops of solution were placed on aluminum metallized wafers and spin-coated at 2,000 r.p.m. from a static start. A cleaned out stripe was formed across each wafer using a cotton swab dampened with Cellosolve acetate following which the coatings were prebaked at 85° C. for 30 minutes.

Three aqueous alkaline solutions were prepared at decreasing pH levels as determined by using a glass electrode standardized with pH 10.08 Beckman buffer solution. The highest pH solution had a pH of 12.55 at room temperature. It contained about 2.5% solids comprising a mixture of sodium meta-silicate and sodium phosphate, predominantly sodium ortho-phosphate. The second solution having a pH of 12.06 was prepared by adding 9.0 grams of sodium bicarbonate to 1700 ml. of the first solution. The third solution having a pH of 11.19 was prepared by adding 18.0 grams of sodium bicarbonate to 1700 ml. of the first solution. A resist coated, striped wafer was then immersed in each solution and the time required for the removal of the coating from the wafer was visually observed.

CLOUD POINT

The cloud points of the phenol-formaldehyde resins were determined by dissolving one gram of the resin in 50 ml. of 1 N NaOH and titrating with 1 N HCl while recording the pH of the solution using a glass electrode standardized with pH 10.10 Beckman buffer solution. The solution was titrated until the solution became moderately cloudy due to the initial precipitation of resin particles at which point the pH was recorded as the cloud point.

EXAMPLE 1

Three positive photoresist compositions were prepared. The first composition, (I), was a conventional formulation containing a m-cresol formaldehyde novolak resin which had a cloud point, as determined by the above described procedure of pH 11.3 and a solubility rate for complete coating removal, as determined by the above described procedure, of about 90 seconds at pH 12.55. It was substantially insoluble at a pH of 12.06 and 11.19. The resin was dissolved in a solvent consisting of 83% ethyl Cellosolve acetate, 9% n-butyl-acetate and 8% xylene along with a typical diazoketone sensitizer, the 4'-2'-3' dihydroxybenzophenone ester of 1-oxo-2-diazonaphthalene - 5 - sulfonic acid as described in U.S. Pat. 3,201,239, for example. The solids content of the solution was about 17% of which about 1/4 was sensitizer.

A second composition, (II), was prepared by adding to 10 ml. of the first composition, 2 ml. of an 18% by weight solution in the same solvent mixture of an m-cresol formaldehyde novolak resin having a solubility rate of less than about 10 seconds at pH's of 12.55, 12.06 and 11.19 and a cloud point of pH 10.40 as determined by the above described procedures.

The third composition, (IIa), was prepared using the same resins as the second except that the proportions were 8 ml. of the first composition to 4 ml. of the added resin solution.

The three resist compositions were spin-coated onto chrome-coated glass plates at 2,000 r.p.m. and prebaked for 30 minutes at 75–80° C. to give coatings of about 0.55 to 0.65 micron thickness. The coatings were exposed through a mask pattern to a 200 watt mercury lamp for from 4–18 seconds, depending upon the speed of the resist, using a contact printer through a percent transmission calibrated, Inconel on glass stepwedge. The exposed coatings were developed for 60 seconds using a conventional alkaline developer for positive photoresists which was an aqueous solution of about 2.5% by weight solids comprising a mixture of sodium meta-silicate and sodium phosphate, predominantly sodium ortho-phosphate having a pH at room temperature of about 12.55. The speed was evaluated as Minimum Exposure Time, (MET), for complete cleanout of exposed background resist in an image area under the stepwedge. This was calculated by multiplying exposure time, in seconds, by percent transmission of the wedge step corresponding to the completely cleaned out resist step. The data in Table 1 below were obtained.

TABLE 1

| Composition | Ml. first novolak | Ml. second novolak | MET, sec. | Relative speed |
|---|---|---|---|---|
| I | 10 | 0 | 8.0 | 1 |
| II | 10 | 2 | 1.6 | 5 |
| IIa | 8 | 4 | (*) | ---------- |

* Wash off of unexposed resist.

It is evident from the data that a large speed increase was achieved by the addition of the second resin to form composition II. Also the second resin should not be added in excessive amounts which cause loss of unexposed resist as occurred with composition IIa. The image quality resulting from exposure and development of the fast resist composition II was comparable to that of the conventional resist of composition I.

EXAMPLE 2

The first and second resist compositions of Example 1 were coated on chrome-glass plates and exposed using the procedure described in Example 1. The exposed coatings were developed for various times both with the developer used in Example 1 and with a diluted developer containing about 1.7% solids as shown in Table 2 below. The minimum exposure time (MET), and relative speeds were determined as in Example 1.

TABLE 2

| Developer time, seconds | Developer, percent solids | MET, Composition I | MET, Composition II | Relative speed |
|---|---|---|---|---|
| 20 | 2.5 | 10.5 | 3.0 | 3.5 |
| 60 | 2.5 | 8.0 | 1.6 | 5.0 |
| 180 | 2.5 | 5.9 | *.5 | 10.2 |
| 60 | 1.7 | 13.5 | 3.8 | 3.6 |
| 180 | 1.7 | 8.9 | 2.1 | 4.2 |
| 360 | 1.7 | 7.3 | *1.1 | 6.6 |

*Resist edges thinned.

From the data in Table 2, it is evident that the optimum relative speed to obtain comparable images can be achieved by varying the development conditions with longer development times giving the resin mixtures of the invention a greater relative exposure speed over the conventional resins. This optimization provides the compositions of the invention with a great over-all speed advantage over conventional positive photoresists despite the longer development time when a step and repeat type of exposure is required where, for example, 10 to 100 exposures are needed to expose one complete pattern or series of patterns. The slightly longer development time needed to achieve optimum speed advantage in this case becomes relatively unimportant. The faster speed also provides a practical photoresist system where light sources of diminished or limited intensity must be used such as in projection and direct reduction exposure processes. This is especially valuable in instances where highly filtered monochromatic exposure sources of inherently greatly reduced intensity are desired.

EXAMPLE 3

A resist formulation was prepared by mixing varying amounts of composition I of Example 1 with a meta-cresol/phenol/formaldehyde novolak resin having a rate of solution of less than 15 seconds at pH's of 12.55 and 12.06, which was substantially insoluble after 5 minutes at a pH of 11.19 and which has a cloud point at a pH of 11.15. Coatings on chrome-glass plates were exposed and developed using the procedures of Example 1. The results are given in Table 3.

TABLE 3

| Composition | Ml, 1st novolak | 18% by weight, m-cresol/phenol/formaldehyde | MET | Relative speed |
|---|---|---|---|---|
| I | 10 | 0 | 9.2 | 1 |
| IIIa | 11 | 1 | 6.6 | 1.4 |
| IIIb | 10 | 2 | 3.6 | 2.6 |
| IIIc | 8 | 4 | (*) | |

*Thin images resulted, partial wash off.

From the results shown in Table 3, a relative speed increase of at least 2.6 over the conventional resin was achieved in composition IIIb with no observable loss in image quality.

EXAMPLE 4

Resist coated chrome-glass plates were exposed in a Mann 1595 photorepeater to a 10× single segment reduced to a 1× image for increasing times in ½ second increments. The composition I of Example 1 required a MET of 7.5 seconds for complete clean out of exposed resist. A composition, (IV), comprising 8 ml. of composition I and 4 ml. of an 18% by weight solution of a phenol-formaldehyde resole resin having a solubility rate of less than 30 seconds at pH 12.0 and a cloud point below 11.3 (Phenodur 373U product of Hoechst) when exposed and developed in the same manner gave a MET of only 2.0 seconds or a relative speed of between 3 and 4 times as fast.

EXAMPLE 5

A resist composition, (V), comprising 2 ml. of 18% by weight solution of a m-cresol-formaldehyde novolak resin and 10 ml. of composition I of Example 1 was prepared. The resin had a rate of solution of less than 15 seconds at pH's of 12.55 and 12.06 and about 30 seconds at 11.19 and a cloud point at pH 10.68. The composition was coated on chrome glass and gave a MET of 2.2 seconds or a three fold increase over a control sample of composition I alone. The image was post-baked and the chrome etched using conventional procedures without difficulty to produce a high quality chrome mask.

The above examples show the great speed increases achievable by the use of the compositions of the invention.

The compositions of the invention are particularly advantageous where exposure speeds limit the practicality of a resist process such as step and repeat, automated, and projection printing processes.

What is claimed is:

1. A photoresist composition comprising a mixture of
(a) a first phenol-formaldehyde novolak resin portion which is substantially insoluble in an aqueous alkaline solution having a pH of about 12 or less,
(b) a second phenol-formaldehyde novolak or resole resin portion which is rapidly soluble in an aqueous alkaline solution at a pH of about 12 or less, wherein said second resin portion is present in an amount by weight of the weight of said first resin portion such that said composition is substantially insoluble in aqueous alkali at a pH of about 12.5 prior to exposure but rapidly soluble after exposure in aqueous alkali at a pH of about 12.5,
(c) a diazo ketone sensitizer.

2. The composition of claim 1 wherein said second resin portion constitutes from about 10 to about 30 percent by weight of the total resin solids.

3. The composition of claim 2 wherein said sensitizer is present in amounts of from about 12 to 30 percent by weight of the resin components of the resist formulation.

4. The composition of claim 2 wherein said sensitizer has the general formula

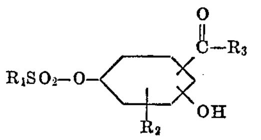

in which $R_1$ is a naphthoquinone-(1,2)-diazide radical, $R_2$ is selected from the group consisting of hydrogen, alkyl, aryl, alkoxy, aryloxy, amino, and heterocyclic groups.

5. A photoresist coating composition comprising a mixture of
(a) a first phenol-formaldehyde novolak resin portion which is substantially insoluble in an aqueous alkaline solution having a pH of about 12 or less,
(b) a second phenol-formaldehyde novolak or resole resin portion which is rapidly soluble in an aqueous alkaline solution at a pH of about 12 or less, wherein said second resin portion is present in an amount by weight of the weight of said first resin portion such that said composition is substantially insoluble in aqueous alkali at a pH of about 12.5 prior to exposure but rapidly soluble after exposure in aqueous alkali at a pH of about 12.5,
(c) a diazo ketone sensitizer,
(d) an organic solvent.

6. A photoresist composition comprising a layer supported on a substrate including a mixture of
(a) a first phenol-formaldehyde novolak resin portion which is substantially insoluble in an aqueous alkaline solution having a pH of about 12 or less,
(b) a second phenol-formaldehyde novolak or resole resin portion which is rapidly soluble in an aqueous alkaline solution at a pH of about 12 or less, wherein said second resin portion is present in an amount by weight of the weight of said first resin portion such that said composition is substantially insoluble in aqueous alkali at a pH of about 12.5 prior to exposure but rapidly soluble after exposure in aqueous alkali at a pH of about 12.5,
(c) a diazo ketone sensitizer.

7. The composition of claim 5 wherein said second resin portion constitutes from about 10 to about 30 percent by weight of the total resin solids.

References Cited

UNITED STATES PATENTS

| | | | |
|---|---|---|---|
| 3,201,239 | 8/1965 | Neugebauer et al. | 96—91 D |
| 3,526,503 | 9/1970 | Dunham et al. | 96—91 D |

RONALD H. SMITH, Primary Examiner

U.S. Cl. X.R.

96—75

PO-1050
(5/69)

UNITED STATES PATENT OFFICE
CERTIFICATE OF CORRECTION

Patent No. 3,666,473 Dated May 30, 1972

Inventor(s) Lucas A. Colom and Harold A. Levine

It is certified that error appears in the above-identified patent and that said Letters Patent are hereby corrected as shown below:

In the claims:

Claim 4, Column 6, Line 23 after "$R_2$" insert -- is selected from the group consisting of hydrogen and hydroxyl, and $R_3$ -- .

Signed and sealed this 9th day of January 1973.

(SEAL)
Attest:

EDWARD M.FLETCHER,JR.
Attesting Officer

ROBERT GOTTSCHALK
Commissioner of Patents